(12) United States Patent
Zhang et al.

(10) Patent No.: US 12,355,453 B2
(45) Date of Patent: Jul. 8, 2025

(54) ADC CIRCUIT BASED SIGNAL DIGITIZATION DEVICE AND METHOD THEREOF

(71) Applicant: SUZHOU MI TU OPTOELECTRONIC TECHNOLOGY CO. LTD., Suzhou (CN)

(72) Inventors: Zhi Zhang, Suzhou (CN); Xiao Han, Suzhou (CN); Rongzhao Tang, Suzhou (CN)

(73) Assignee: SUZHOU MI TU OPTOELECTRONIC TECHNOLOGY CO. LTD., Jiangsu (CN)

( * ) Notice: Subject to any disclaimer, the term of this patent is extended or adjusted under 35 U.S.C. 154(b) by 235 days.

(21) Appl. No.: 18/137,357

(22) Filed: Apr. 20, 2023

(65) Prior Publication Data

US 2023/0370078 A1   Nov. 16, 2023

(30) Foreign Application Priority Data

May 16, 2022   (CN) .......................... 202210526715.5

(51) Int. Cl.
 *H03M 1/06* (2006.01)
(52) U.S. Cl.
 CPC ................................. *H03M 1/0604* (2013.01)

(58) Field of Classification Search
 CPC .... H03M 1/0604; H03M 1/0697; H03M 1/20; H03M 1/007
 See application file for complete search history.

(56) References Cited

U.S. PATENT DOCUMENTS

| | | | | |
|---|---|---|---|---|
| 4,309,772 A * | 1/1982 | Kloker | ................ | H04L 27/1566 341/51 |
| 4,542,370 A * | 9/1985 | Yamada | .................. | H03M 1/16 327/75 |
| 4,970,511 A * | 11/1990 | Mills | ....................... | H03M 1/26 341/13 |
| 5,742,248 A * | 4/1998 | Vorenkamp | ......... | H03M 1/0682 330/252 |
| 6,337,646 B1 * | 1/2002 | Hatani | ................ | H03M 1/0612 341/118 |

(Continued)

*Primary Examiner* — Lam T Mai
(74) *Attorney, Agent, or Firm* — SZDC Law PC

(57) ABSTRACT

Provided is an ADC circuit based signal digitalization method, including: inputting the analog signal to the ADC circuit, and after being converted by the ADC circuit for the first time, outputting a first ADC output value $M_i$; adjusting the least significant bit of the ADC circuit based on the value of the higher bits of the output value $M_i$, turning down the least significant bit of the ADC circuit, when all the values of the higher bits of the output value $M_i$ are 0; inputting the analog signal to the ADC circuit again, and then outputting the ADC output value $M_{i+1}$ for the i+1 time; outputting the final signal conversion result and the adjusted least significant bit based on all the ADC output values. The present invention could improve the ADC precision of small signals without increasing the ADC circuit size.

6 Claims, 3 Drawing Sheets

(56) References Cited

U.S. PATENT DOCUMENTS

| | | | | |
|---|---|---|---|---|
| 6,340,943 B1* | 1/2002 | Chow | H03M 1/145 | 341/161 |
| 7,193,547 B2* | 3/2007 | Ho | H03M 3/496 | 341/143 |
| 7,495,589 B1* | 2/2009 | Trifonov | H03M 3/382 | 341/120 |
| 8,125,363 B2* | 2/2012 | Kobata | H03M 1/0641 | 708/271 |
| 8,305,007 B2* | 11/2012 | Zhao | H05B 45/46 | 341/160 |
| 8,749,419 B2* | 6/2014 | Moldsvor | H03M 1/0656 | 341/122 |
| 9,571,114 B1* | 2/2017 | Shen | H03M 1/069 | |
| 9,608,655 B1* | 3/2017 | Li | H03M 1/145 | |
| 9,608,658 B1* | 3/2017 | Rajaee | H03M 1/1009 | |
| 10,530,382 B2* | 1/2020 | Kong | H03M 1/468 | |
| 10,826,513 B1* | 11/2020 | Yang | H03M 1/0607 | |
| 11,251,807 B1* | 2/2022 | Ren | H03M 3/458 | |
| 2002/0158789 A1* | 10/2002 | Yoshioka | H03M 1/1215 | 341/156 |
| 2005/0275571 A1* | 12/2005 | Bjornsen | H03M 3/35 | 341/119 |
| 2006/0022854 A1* | 2/2006 | Bjornsen | H03M 1/0641 | 341/120 |
| 2009/0146859 A1* | 6/2009 | Terranova | H03M 1/0604 | 341/159 |
| 2010/0134337 A1* | 6/2010 | Gotoh | H03M 1/0695 | 341/159 |
| 2011/0012519 A1* | 1/2011 | Zhao | H05B 45/46 | 341/120 |
| 2014/0328353 A1* | 11/2014 | Li | H03M 1/007 | 370/474 |
| 2016/0150173 A1* | 5/2016 | Johansson | H03M 1/0634 | 348/308 |
| 2019/0081636 A1* | 3/2019 | Chen | H03M 1/462 | |
| 2023/0147156 A1* | 5/2023 | Fajarmega | H03M 1/462 | 341/155 |

\* cited by examiner

ADC CIRCUIT BASED SIGNAL DIGITIZATION DEVICE AND METHOD THEREOF

This application claims priority to Chinese Patent Application No. 202210526715.5, filed on May 16, 2022, which is incorporated by reference for all purposes as if fully set forth herein.

TECHNICAL FIELD

The present invention relates to an ADC circuit based signal digitization device and method thereof, which belongs to the analog electronic circuit technology.

BACKGROUND OF THE INVENTION

When using the chip, we need to pick up and output the internal analog signal, and the internal signal is usually output to the external circuit or device of the chip for detection. Due to the improvement of the integration, more and more built-in ADCs are designed to accomplish the digitalization of analog signal and output them through SPI/I2C.

As shown in FIG. 2, in the prior art scheme, the n+1 bits ADC gains the data for n+1 bits signal; with the decrease of the chip size, when output the signal of a large dynamic range, a high-precision ADC is required, i.e., a ADC with a higher bit digital signal is required; however, the problem is that the size of the ADC needs to be doubled for each additional bit of the ADC.

SUMMARY

The objective of the present invention is to provide an ADC circuit based signal digitization device and method thereof, and it could improve the ADC precision without increasing the ADC circuit size.

To achieve the above objective, the invention provides the following technical scheme.

An ADC circuit based signal digitization method, comprising:
S1. inputting the analog signal to the ADC circuit, after being converted by the ADC circuit for the first time, outputting a first ADC output value $M_i=1$
S2. adjusting the least significant bit of the ADC circuit based on the value of the higher bits of the output value $M_i$, turning down the least significant bit of the ADC circuit, when all the values of the higher bits of the output value $M_i$ are 0; inputting the analog signal to the ADC circuit one more time, and then outputting the ADC output value $M_{i+1}$ for the i+1 time;
S3. judging the precision of the output value $M_{i+1}$ and the values of the higher bits of the output value $M_i$, when the precision of the output value $M_{i+1}$ meets the output requirement, or the value of the most significant bit of the output value $M_i$ is 1, turning to step S4, otherwise, making i=i+1 and turning to step S2;
S4. outputting the final signal conversion result and the adjusted least significant bit based on all the ADC output values.

Furthermore, the step of adjusting the least significant bit of the ADC circuit based on the value of the higher bits of the output value $M_i$ in step S2 comprises:
S21, making the ADC circuit comprise n+1 bits, outputting the first ADC output value $M_i$, after the analog signal being converted by the ADC circuit; the output value $M_i$ includes n+1 bits from high to low, which are defined as $D_{i,n}, D_{i,n-1}, \ldots, D_{i,1}, D_{i,0}$;
S22. analyzing the values of the bits of the output value $M_i$, when all the values of $D_{i,n}, D_{i,n-1}, \ldots, D_{i,x}$ are 0, making the least significant bit of the ADC circuit $LSB_i$ decrease to $LSB_{i+1}=LSB_i/y$, in which $0<y<=(n+1)/(x+1)$, x is a positive integer greater than 0 and less than n.

In addition, when x is a fixed value specified externally, determining whether to adjust the least significant bit of the ADC circuit by judging whether the sum of the higher n−x bits of the output value $M_i$ is equal to 1, and only outputting the final signal conversion result.

Additionally, the signal digitization method comprises: setting a corresponding maximum conversion time based on the correlation properties of different application scenarios; calculating the maximum conversion times $i_{max}$ for the ADC circuit based on the maximum conversion time, in which $i \leq i_{max}$, and the correlation properties include the signal amplitude change value, signal output precision requirements and real-time requirements.

In addition, the process for step S4 is that combining all ADC output values to weight and average to obtain the final signal conversion result.

Moreover, an ADC circuit based signal digitalization device is also provided by the present invention, comprising:
a conversion and control module used to input the analog signal to the ADC circuit, and judge the precision of the output value of the ADC circuit, and then determine whether to input the analog signal to the ADC circuit for the next conversion, comprising an output terminal connected to the input terminal of the ADC circuit, and an input terminal connected to the output terminal of the ADC circuit;
an ADC circuit used to convert the analog signal input by the conversion and control module into the corresponding digital signal, including n+1 bits;
a module for adjusting the least significant bit used to adjust the least significant bit of the ADC circuit based on the value of the higher bits of the ADC circuit output value, and turn down the least significant bit when all the values of the higher bits of the output value are 0, comprising an input terminal connected to the output terminal of the ADC circuit, and an output terminal connected to the control terminal of the ADC circuit;
an output value statistics module used to store all the ADC circuit output values corresponding to the analog signal; and configured to connect to the input terminal of the ADC circuit;
an output module used to transfer all output values stored in the output value statistics module to output the final signal conversion result and the adjusted least significant bit.

The advantages of the present invention are:
firstly, the ADC circuit based signal digitalization method provided by the present invention could improve the ADC precision of small signals through two or more times of the ADC conversions; specifically, by two or more times of the ADC conversions, it could make the low bits ADC achieve the high bits effect, and reduce the chip size at the same time.
secondly, according to the ADC circuit based signal digitalization method provided by the present invention, ADC conversion times and the least significant bit could be either specified or adaptively adjusted based on the input analog, thereby making the method of the present invention meet the requirements of different application scenarios.

thirdly, the ADC circuit based signal digitalization method provided by the present invention could improve the precision of the output value through multiple times of weighting and averaging to the ADC output values.

The foregoing explanation is only an overview of the technical scheme of this invention. In order to better understand the technical means of this invention and implement it in accordance with the content of the specification, the following is a better implementation example of this invention together with the attached drawings for detailed explanation.

BRIEF DESCRIPTION OF THE DRAWINGS

FIG. 4 is a schematic diagram of how to improve the precision of the ADC circuit-based signal digitization method in an embodiment of the present invention.

DETAILED DESCRIPTION OF THE INVENTION

Figure 1:
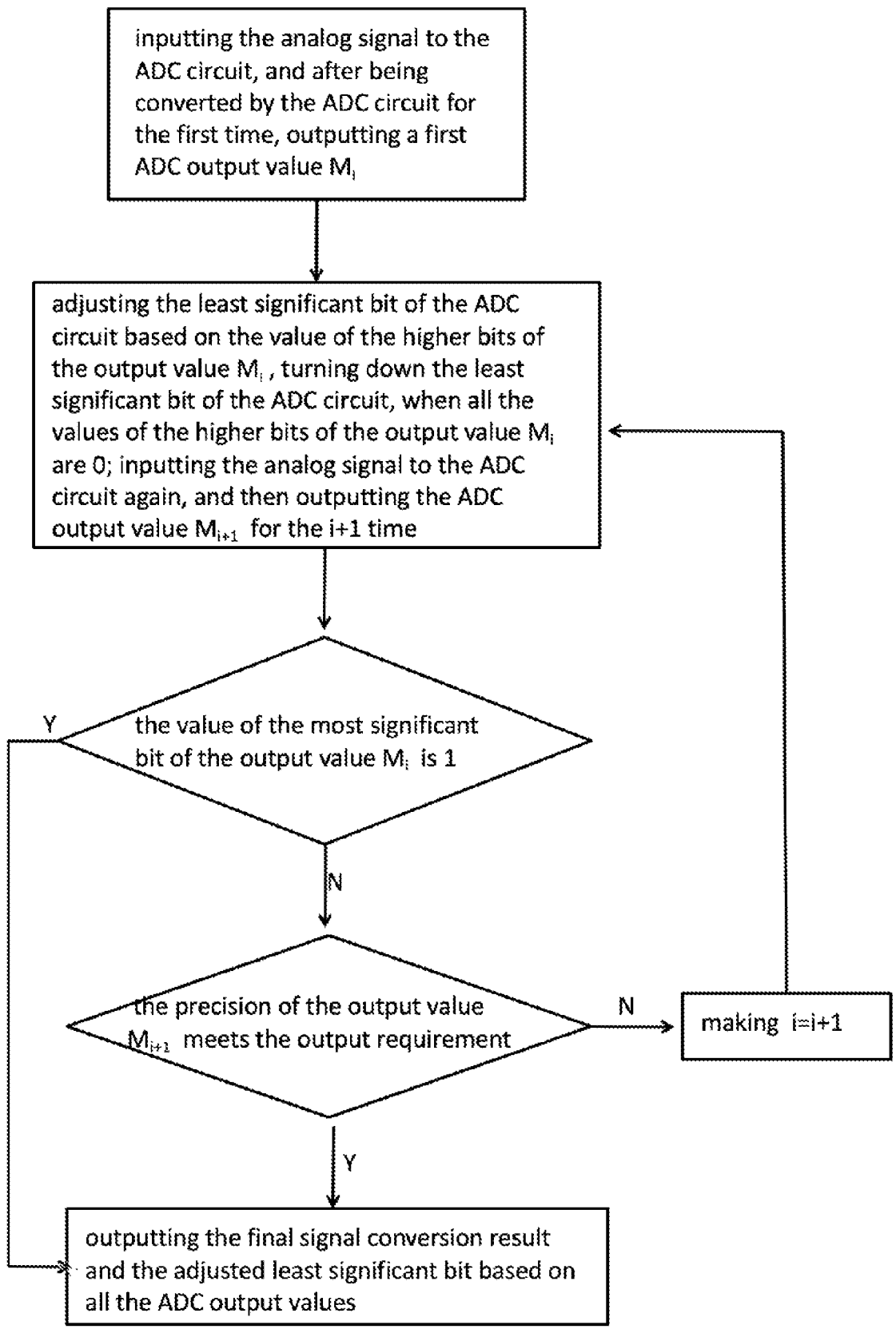
FIG. 1 is a flow chart of the ADC circuit based signal digitalization method according to an embodiment of the present invention.
Figure 2:
FIG. 2 is an output principle diagram of the ADC circuit of the prior art.

The technical solutions in the embodiments of the present invention will be clearly and completely described below with reference to the drawings in the embodiments of the present invention. Obviously, the described embodiments are only a part of the embodiments of the present invention, but not all the embodiments. Based on the embodiments of the present invention, all other embodiments obtained by a person of ordinary skill in the art without creative efforts shall fall within the protection scope of the present invention.

In the description of the present invention, it should be noted that the orientation or position relationships indicated by the terms "center, higher, lower, left, right, vertical, horizontal, inside and outside" are based on the orientation or position relationships shown in the drawings, and are only for it is convenient to describe the present invention and simplify the description, rather than indicating or implying that the device or element referred to must have a specific orientation, be constructed and operate in a specific orientation, and therefore cannot be understood as limitation on the present invention. In addition, the terms "first", "second" and "third" are used for descriptive purpose only and cannot be understood as indicating or implying relative importance.

In the description of the present invention, it should be noted that the terms "installation", "connected with", and "connected to" should be understood in a broad sense unless explicitly stated and limited otherwise. For example, they may be "fixed connected" or "removable connected", or "integratedly connected"; they may be "mechanically connected", or "electronically connected", or "directly connected", or "indirectly connected through an intermediated medium", or "internal connection of two elements or the interaction of two elements relationships". For those of ordinary skill in the art, the specific meanings of the above terms in the present invention can be understood according to specific situations. Furthermore, the technical features mentioned in the different embodiments of the invention described below may be combined with each other as long as they do not conflict with each other.

Figure 4A:
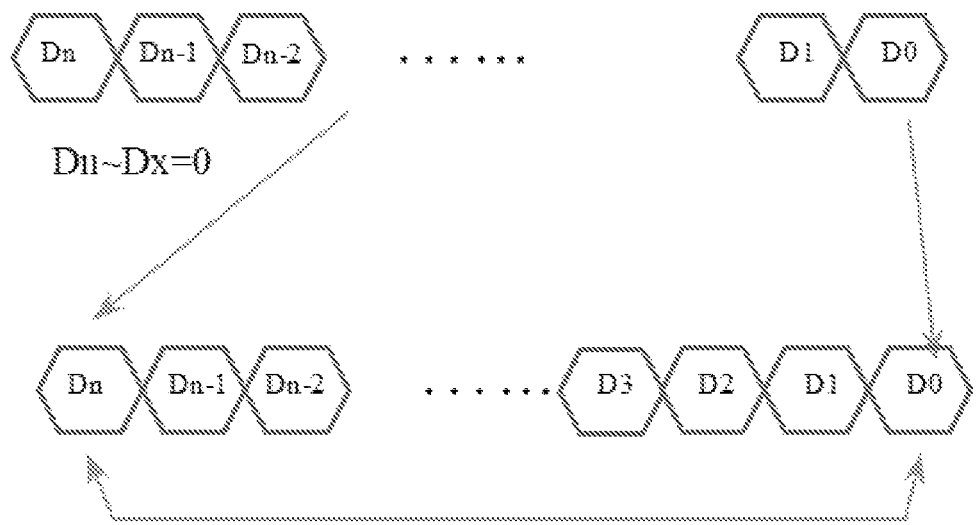
FIG. 4(a) is a schematic diagram of how a n+1 bits ADC circuit achieving higher precision for small signals.

FIG. 1 is the flow chart of the ADC circuit based signal digitalization method according to an embodiment of the present invention. As shown in FIG. 1, the method comprises:

S1. inputting the analog signal to the ADC circuit, and after being converted by the ADC circuit for the first time, outputting a first ADC output value $M_i=1$;

S2. adjusting the least significant bit of the ADC circuit based on the value of the higher bits of the output value $M_i$, turning down the least significant bit of the ADC circuit, when all the values of the higher bits of the output value $M_i$ are 0; inputting the analog signal to the ADC circuit again, and then outputting the ADC output value $M_{i+1}$ for the i+1 time;

S3. judging the precision of the output value $M_{i+1}$ and the value of the higher bits of the output value $M_i$, when the precision of the output value $M_{i+1}$ meets the output requirement, or the value of the most significant bit of the output value $M_i$ is 1, turning to step S4, otherwise, making i=i+1 and turning to step S2;

S4. outputting the final signal conversion result and the adjusted least significant bit based on all the ADC output values. In the present embodiment, the ADC circuit could be integrated in the chip, or connected to the chip externally. As shown in FIG. 4(a), ADC's LSB (least significant bit) is controlled by the higher bits (Dn~Dx), x is a positive integer greater than 0 and less than n, when one value of the higher bits (Dn~Dx) is high, the LSB remains constant; when all the values of the higher bits (Dn~Dx) are low, LBS becomes LSB/Y, that is to decrease LSB, and to improve the ADC precision.

Accordingly, the process for adjusting the significant least bit of the ADC circuit based on the value of the higher bits of the output value $M_I$ in step S2 includes:

S21. making the ADC circuit comprise n+1 bits, outputting the first ADC output value $M_I$, after the analog signal being converted by the ADC circuit; the output value $M_I$ includes n+1 bits from high to low, which are defined as $D_{I,n}, D_{I,n-1}, \ldots, D_{I,1}, D_{I,0}$;

S22. Analyzing the values of the bits of the output value $M_I$, when all the values of $D_{I,n}, D_{I,n-1}, \ldots, D_{I,x}$ are 0, making the least significant bit of the ADC circuit LSB decrease to $LSB_{i+1}=LSB_i/y$, in which $0<y<=(n+1)/(x+1)$, x is a positive integer greater than 0 and less than n.

Figure 3:
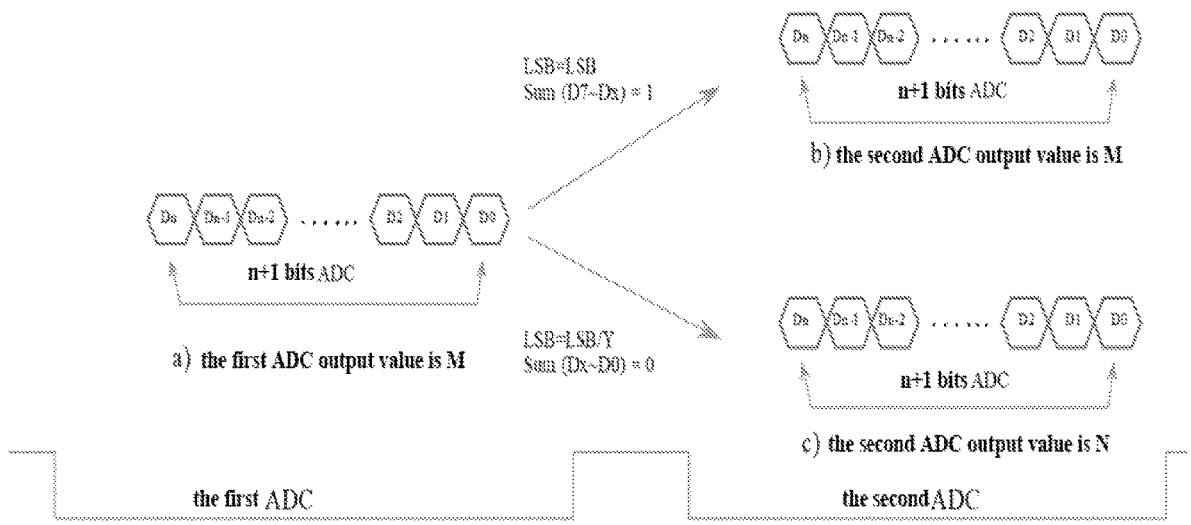
FIG. 3 is a principle diagram of the two-time signal digitalization in an embodiment of the present invention.

As shown in FIG. 3, after the first ADC conversion, the ADC output value is M, and the ADC precision is n+1; if one value of the higher bits (Dn~Dx) of M is high, then ADC's LSB would remain constant, and then the second ADC conversion would be performed, the second ADC output value would still be M, and the ADC precision would still be n+1. If all the values of the higher bits (Dn~Dx) of M are 0, then the LSB would decrease to LSB/Y, and then the second ADC conversion would be performed, the second conversion output value is N (the value of N is closer to the real input value of the ADC, approximately equal to the value of M/Y, but the precision is higher than M). Therefore, after two conversions, especially when all values of the higher bits (Dn~Dx) are zero, the ADC LSB decreases, the ADC precision of the small signal is improved.

There are many ways to change the LSB of an ADC, because the LSB could be a current, a voltage, or a resistance, etc. For example, if the quantization comparator of an ADC is a voltage comparator, the LSB of an ADC is the product of the current and resistance: $I_{LSB}*R$, or $I*R_{LSB}$, the LSB/y could be achieved through reducing the current $I_{LSB}$ by a factor of y, or the resistance $R_{LSB}$ by a factor of y.

Preferably, y is a positive integer to facilitate subsequent data processing. Take n=7 or 8 bits ADC for example, assuming that x=3, $LSB_{i+1}=LSB_i/y$; $y<=(n+1)/(x+1)$, y could be 2; and once again, assuming that x=1, y could be 4, 3, 2. Assuming that x=0, y could be 8, 7, 6, 5, 4, 3, 2. Y doesn't have to be 1, if y is 1, the LSB is unchanged.

Figure 4B:
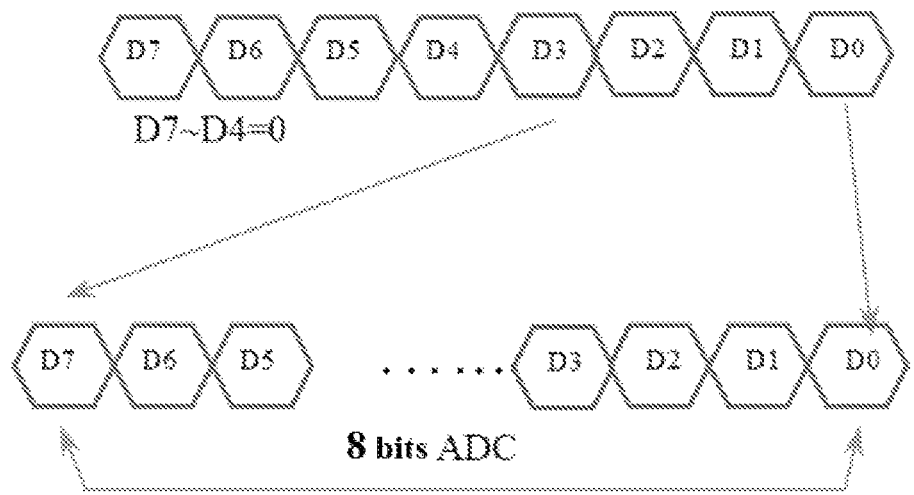
FIG. 4(b) is a schematic diagram of how a 8 bits ADC circuit achieving higher precision (of 9 bits) for small signals, when n=7, x=3.

In the present embodiment, the value of x could be specified by an external circuit or adaptively adjusted based on the amplitude of the input signal, depending on the specific application scenario. For example, in a certain application scenario, where the signal amplitude does not change much or a higher precision of the small signal is required, two or more ADC conversions would be performed by specifying a fixed value; or, for another application scenario, where the signal amplitude varies dramatically, and meanwhile, the higher precision of the small signal is required, the value of x could be adjusted adaptively according to the amplitude of the signal. As shown in FIG. 4(b), taking n=7 and x=3 as an example, the precision of a 9 bits ADC could be achieved with an 8 bits ADC due to reduced LSB.

Similarly, for small signals, the more it converts, the higher the accuracy of output value is, thus the conversion times could also be adjusted adaptively according to the characteristics of the aforementioned application scenarios. It could be determined whether to perform the ADC operation one more time by analyzing the higher bits of the output value after each conversion.

Since it would take more time to perform multiple ADC conversions, the real-time requirements of signal output also need to be considered in specific scenarios. In this case, the maximum conversion time for different application scenarios could be set. According to the maximum conversion time, the maximum ADC conversion times $i_{max}$ could be calculated to make the final conversion times I not exceed the maximum conversion times $i_{max}$, that is $1 \leq i_{max}$.

Preferably, when the x is a fixed value specified externally, determining whether to adjust the least significant bit of the ADC circuit by judging whether the sum of the higher n−x bits of the output value $M_I$ is equal to 1, and only output the final signal conversion result.

In step S4, combining all the ADC output values to weight and average to obtain the final signal conversion result, wherein for the large signal that cannot reduce LSB, the precision of output signal could still be improved by two conversions; for the small signal that can reduce LSB, the final signal conversion result could be obtained by averaging the ADC output values directly; since the output value of the adjusted LSB has higher precision, the final signal conversion result could also be obtained by weighting and averaging the ADC output values, and the weight value could be continuously increased based on the conversion times. The present embodiment also provided an ADC based signal digitalization device for the aforementioned signal digitalization method. The signal digitalization device comprises:

a conversion and control module used to Input the analog signal to the ADC circuit, and judge the precision of the output value of the ADC circuit, and then determine whether to input the analog signal to the ADC circuit for the next conversion, comprising an output terminal connected to the input terminal of the ADC circuit, and an input terminal connected to the output terminal of the ADC circuit;

an ADC circuit used to convert the analog signal Input by the conversion and control module into the corresponding digital signal, including n+1 bits;

a module for adjusting the least significant bit used to adjust the least significant bit of the ADC circuit based on the value of the higher bits of the ADC circuit output value, and turn down the least significant bit when all the values of the higher bits of the output value are 0, comprising an input terminal connected to the output terminal of the ADC circuit, and an output terminal connected to the control terminal of the ADC circuit;

an output value statistics module used to store all the ADC circuit output values corresponding to the analog signal; and configured to connect to the input terminal of the ADC circuit;

an output module used to transfer all output values stored in the output value statistics module to output the final signal conversion result and the adjusted least significant bit.

The technical features of the foregoing embodiments may be combined arbitrarily. For the sake of brevity, all possible combinations of the technical features of the foregoing embodiments are not described. However, as long as there is no contradiction in the combinations of these technical features, all shall be considered to be within the scope of this specification.

The foregoing description has been made on several embodiments of this invention which are relatively specific and detailed, however the invention is not limited thereto. It should be further understood by those skilled in the art that various changes and modifications may be made without departing from the spirit of the invention are protected by this invention. Therefore, the scope of protection for this invention shall be subject to the appended claims.

What is claimed is:

1. An ADC circuit based signal digitalization method, comprising:

S1, inputting an analog signal to the ADC circuit, after being converted by the ADC circuit for a first time, outputting a first ADC output value $M_i$, i=1;

S2, adjusting a least significant bit of the ADC circuit based on a value of a higher bits of the output value $M_i$, turning down the least significant bit of the ADC circuit, when all the values of the higher bits of the output value $M_i$ are 0; inputting the analog signal to the ADC circuit one more time, and then outputting the ADC output value $M_{i+1}$ for an i+1 time;

S3, judging a precision of the output value $M_{i+1}$ and the values of the higher bits of the output value $M_i$, when the precision of the output value $M_{i+1}$ meets the output requirement, or a value of a most significant bit of the output value $M_i$ is 1, turning to step S4, otherwise, making i=i+1 and turning to step S2;

S4, outputting a final signal conversion result and an adjusted least significant bit based on all the ADC output values.

2. The ADC circuit based signal digitalization method of claim 1, wherein the step of adjusting the least significant bit of the ADC circuit based on the value of the higher bits of the output value $M_i$ in step S2 comprises:

S21, making the ADC circuit comprise n+1 bits, outputting a first ADC output value $M_i$, after the analog signal being converted by the ADC circuit; the output value $M_i$ includes n+1 bits from high to low, which are defined as $D_{i,n}, D_{i,n-1}, \ldots, D_{i,1}, D_{i,0}$;

S22, analyzing values of the bits of the output value $M_i$, when the values of $D_{i,n}, D_{i,n-1}, \ldots, D_{i,x}$ are all 0, making the least significant bit of the ADC circuit $LSB_i$ decrease to $LSB_{i+1}=LSB_i/y$, in which $0<y<=(n+1)/(x+1)$, x is a positive integer greater than 0 and less than n.

3. The ADC circuit based signal digitalization method of claim 2, wherein when x is a fixed value specified externally, determining whether to adjust the least significant bit of the ADC circuit by judging whether a sum of the higher n−x bits of the output value $M_i$ is equal to 1, and only outputting the final signal conversion result.

4. The ADC circuit based signal digitalization method of claim 1, wherein the signal digitalization method comprises:
setting a corresponding maximum conversion time based on correlation properties in different application scenarios; calculating a maximum conversion times $i_{max}$ for the ADC circuit based on the maximum conversion time, in which $i \leq i_{max}$, and the correlation properties include a signal amplitude change value, signal output precision requirements and real-time requirements.

5. The ADC circuit based signal digitalization method of claim 1, wherein in step S4, combining all ADC output values to weight and average to obtain the final signal conversion result.

6. An ADC circuit based signal digitalization device, comprising:

a conversion and control module used to input an analog signal to the ADC circuit, and judge a precision of the output value of the ADC circuit, and then determine whether to input the analog signal to the ADC circuit for a next conversion, comprising an output terminal connected to an input terminal of the ADC circuit, and an input terminal connected to an output terminal of the ADC circuit;

an ADC circuit used to convert the analog signal input by the conversion and control module into a corresponding digital signal, including n+1 bits;

a module for adjusting a least significant bit used to adjust the least significant bit of the ADC circuit based on a value of the higher bits of the ADC circuit output value, and turn down the least significant bit when all the values of the higher bits of the output value are 0, comprising an input terminal connected to the output terminal of the ADC circuit, and an output terminal connected to a control terminal of the ADC circuit;

an output value statistics module used to store all the ADC circuit output values corresponding to the analog signal; and configured to connect to the input terminal of the ADC circuit;

an output module used to transfer all output values stored in the output value statistics module to output a final signal conversion result and an adjusted least significant bit.

* * * * *